United States Patent
Zhang et al.

(10) Patent No.: US 8,853,054 B2
(45) Date of Patent: Oct. 7, 2014

(54) METHOD OF MANUFACTURING SILICON-ON-INSULATOR WAFERS

(75) Inventors: Guoqiang Zhang, Ballwin, MO (US); Jeffrey L. Libbert, O'Fallon, MO (US)

(73) Assignee: SunEdison Semiconductor Limited, St. Peters, MO (US)

( * ) Notice: Subject to any disclaimer, the term of this patent is extended or adjusted under 35 U.S.C. 154(b) by 256 days.

(21) Appl. No.: 13/413,284

(22) Filed: Mar. 6, 2012

(65) Prior Publication Data

US 2013/0237032 A1 Sep. 12, 2013

(51) Int. Cl.
*H01L 21/46* (2006.01)
*H01L 21/30* (2006.01)

(52) U.S. Cl.
USPC ........... 438/455; 438/457; 438/459; 438/691; 438/734; 438/977; 257/E21.32; 257/E21.567

(58) Field of Classification Search
None
See application file for complete search history.

(56) References Cited

U.S. PATENT DOCUMENTS

| | | | |
|---|---|---|---|
| 3,964,957 A | 6/1976 | Walsh | |
| 4,251,317 A | 2/1981 | Foote | |
| 4,388,140 A | 6/1983 | Nakazato et al. | |
| 4,588,473 A | 5/1986 | Hisatomi et al. | |
| 4,849,701 A | 7/1989 | Saatkamp et al. | |
| 4,888,304 A * | 12/1989 | Nakagawa et al. | 438/406 |
| 4,971,645 A | 11/1990 | Licus | |
| 5,032,544 A * | 7/1991 | Ito et al. | 438/459 |
| 5,189,500 A | 2/1993 | Kusunoki | |
| 5,211,794 A | 5/1993 | Enomoto et al. | |
| 5,233,218 A | 8/1993 | Miura | |
| 5,236,548 A | 8/1993 | Stadler et al. | |
| 5,246,528 A | 9/1993 | Hasegawa et al. | |
| 5,340,437 A | 8/1994 | Erk et al. | |
| 5,425,846 A | 6/1995 | Koze et al. | |
| 5,429,711 A | 7/1995 | Watanabe et al. | |
| 5,494,849 A * | 2/1996 | Iyer et al. | 438/459 |
| 5,668,045 A | 9/1997 | Golland et al. | |
| 5,783,097 A | 7/1998 | Lo et al. | |
| 5,825,385 A | 10/1998 | Silverbrook | |

(Continued)

FOREIGN PATENT DOCUMENTS

| | | |
|---|---|---|
| EP | 529888 A1 | 3/1993 |
| EP | 0544131 A1 | 6/1993 |

(Continued)

OTHER PUBLICATIONS

PCT International Search Report and Written Opinion of the International Searching Authority regarding PCT/US2013/027794 filed on Feb. 26, 2013 mailed on Sep. 9, 2013, 8 pgs.

(Continued)

*Primary Examiner* — Zandra Smith
*Assistant Examiner* — Khanh Duong
(74) *Attorney, Agent, or Firm* — Armstrong Teasdale LLP

(57) ABSTRACT

A method is provided for preparing multilayer semiconductor structures, such as silicon-on-insulator wafers, having reduced warp and bow. Reduced warp multilayer semiconductor structures are prepared by forming a dielectric structure on the exterior surfaces of a bonded pair of a semiconductor device substrate and a semiconductor handle substrate having an intervening dielectric layer therein. Forming a dielectric layer on the exterior surfaces of the bonded pair offsets stresses that may occur within the bulk of the semiconductor handle substrate due to thermal mismatch between the semiconductor material and the intervening dielectric layer as the structure cools from process temperatures to room temperatures.

16 Claims, 2 Drawing Sheets

(56) References Cited

U.S. PATENT DOCUMENTS

| | | |
|---|---|---|
| 5,834,812 A | 11/1998 | Golland et al. |
| 5,843,322 A | 12/1998 | Chandler, Jr. |
| 5,849,627 A * | 12/1998 | Linn et al. .................... 438/455 |
| 5,863,829 A * | 1/1999 | Nakayoshi et al. ........... 438/459 |
| 5,879,577 A | 3/1999 | Weng et al. |
| 5,933,902 A | 8/1999 | Frey |
| 5,945,351 A | 8/1999 | Mathuni |
| 6,046,117 A | 4/2000 | Bauer et al. |
| 6,110,839 A | 8/2000 | Nakano et al. |
| 6,117,778 A | 9/2000 | Jones et al. |
| 6,152,507 A | 11/2000 | Pirker |
| 6,162,739 A | 12/2000 | Sumnitsch et al. |
| 6,236,104 B1 | 5/2001 | Falster |
| 6,294,469 B1 | 9/2001 | Kulkami et al. |
| 6,309,981 B1 | 10/2001 | Mayer et al. |
| 6,328,846 B1 | 12/2001 | Langen et al. |
| 6,333,275 B1 | 12/2001 | Mayer et al. |
| 6,342,725 B2 | 1/2002 | Falster |
| 6,368,192 B1 | 4/2002 | Jones et al. |
| 6,383,060 B2 | 5/2002 | Kawasaki et al. |
| 6,395,646 B1 | 5/2002 | Liu |
| 6,482,749 B1 | 11/2002 | Billington et al. |
| 6,494,221 B1 | 12/2002 | Sellmer et al. |
| 6,497,784 B1 | 12/2002 | Jones et al. |
| 6,503,363 B2 | 1/2003 | Nakano et al. |
| 6,523,553 B1 | 2/2003 | Redeker et al. |
| 6,586,342 B1 | 7/2003 | Mayer et al. |
| 6,743,495 B2 | 6/2004 | Vasat et al. |
| 6,808,781 B2 * | 10/2004 | Mule'Stagno et al. ...... 428/64.1 |
| 6,833,063 B2 | 12/2004 | Basol |
| 6,849,901 B2 | 2/2005 | Falster |
| 6,881,675 B2 | 4/2005 | Pan et al. |
| 6,897,084 B2 | 5/2005 | Binns et al. |
| 6,930,375 B2 | 8/2005 | Falster et al. |
| 6,939,807 B2 | 9/2005 | Yun |
| 7,007,702 B2 | 3/2006 | Langen |
| 7,029,567 B2 | 4/2006 | Basol |
| 7,071,080 B2 | 7/2006 | Falster et al. |
| 7,135,351 B2 | 11/2006 | Binns et al. |
| 7,223,323 B2 | 5/2007 | Yang et al. |
| 7,323,421 B2 | 1/2008 | Stinson et al. |
| 7,446,018 B2 * | 11/2008 | Brogan et al. ................ 438/459 |
| 7,485,928 B2 | 2/2009 | Falster et al. |
| 7,867,059 B2 | 1/2011 | Pietsch et al. |
| 8,026,145 B2 | 9/2011 | Falster et al. |
| 2001/0015170 A1 | 8/2001 | Kitabatake |
| 2002/0113265 A1 | 8/2002 | Falster |
| 2002/0174828 A1 | 11/2002 | Vasat et al. |
| 2003/0008435 A1 | 1/2003 | Falster et al. |
| 2003/0038383 A1 | 2/2003 | Sakaguchi |
| 2003/0049545 A1 | 3/2003 | Katakura |
| 2003/0054641 A1 | 3/2003 | Binns et al. |
| 2003/0116444 A1 | 6/2003 | Basol |
| 2003/0141201 A1 | 7/2003 | Basol |
| 2003/0192469 A1 | 10/2003 | Libbert et al. |
| 2003/0216046 A1 | 11/2003 | Pan et al. |
| 2004/0077159 A1 | 4/2004 | Yun et al. |
| 2004/0084315 A1 | 5/2004 | Mizohata et al. |
| 2004/0251518 A1 | 12/2004 | Preusse et al. |
| 2005/0130394 A1 | 6/2005 | Falster |
| 2005/0150867 A1 | 7/2005 | Sax |
| 2005/0150877 A1 | 7/2005 | Araki |
| 2005/0158969 A1 | 7/2005 | Binns et al. |
| 2005/0255671 A1 | 11/2005 | Falster et al. |
| 2006/0026683 A1 | 2/2006 | Lim |
| 2006/0115986 A1 | 6/2006 | Donohoe et al. |
| 2006/0137994 A1 | 6/2006 | Basol et al. |
| 2006/0172538 A1 | 8/2006 | Itzkowitz et al. |
| 2006/0205217 A1 | 9/2006 | Pan et al. |
| 2006/0252272 A1 | 11/2006 | Koyata et al. |
| 2006/0266383 A1 | 11/2006 | Tran et al. |
| 2007/0105279 A1 | 5/2007 | Falster et al. |
| 2007/0161247 A1 | 7/2007 | Koyata et al. |
| 2008/0020168 A1 | 1/2008 | Falster |
| 2009/0130824 A1 | 5/2009 | Falster et al. |
| 2009/0242126 A1 | 10/2009 | Erk et al. |
| 2009/0247055 A1 | 10/2009 | Erk et al. |
| 2011/0159665 A1 | 6/2011 | Witte et al. |

FOREIGN PATENT DOCUMENTS

| | | |
|---|---|---|
| EP | 744082 A1 | 11/1996 |
| EP | 0544131 B1 | 3/1997 |
| EP | 774776 A2 | 5/1997 |
| EP | 924148 A1 | 6/1999 |
| EP | 1058300 A2 | 6/2000 |
| EP | 924148 B1 | 1/2001 |
| EP | 774776 B1 | 4/2003 |
| EP | 1456868 A2 | 9/2004 |
| EP | 1662560 A2 | 5/2006 |
| EP | 1688990 A2 | 8/2006 |
| EP | 1855309 A1 | 11/2007 |
| JP | 57141926 A2 | 2/1982 |
| JP | 2015628 A | 1/1990 |
| JP | 5013388 A | 1/1993 |
| JP | 6244167 A | 9/1994 |
| JP | 10056006 A | 2/1998 |
| JP | 2000082690 A | 3/2000 |
| JP | 2001044147 A | 2/2001 |
| JP | 2001044170 A | 2/2001 |
| JP | 2002043294 A | 2/2002 |
| JP | 2002110626 A | 4/2002 |
| JP | 2002170808 A | 6/2002 |
| JP | 2002334879 A | 11/2002 |
| JP | 2003045845 A | 2/2003 |
| JP | 2004111439 A | 4/2004 |
| JP | 2004149895 A | 5/2004 |
| JP | 2004296810 A | 10/2004 |
| JP | 2005005701 A | 1/2005 |
| WO | 96/17377 A1 | 6/1996 |
| WO | 97/27621 A1 | 7/1997 |
| WO | 03/060963 A2 | 7/2003 |
| WO | 2006060752 A2 | 6/2006 |
| WO | 2006092886 A1 | 9/2006 |
| WO | 2010098007 A1 | 9/2010 |
| WO | 2011067394 A1 | 6/2011 |

OTHER PUBLICATIONS

Co-Owned U.S. Appl. No. 13/130,160, filed May 25, 2011.
Semi 1978, Standards M1-1105E—Specifications for Polished Monocrystalline Wafers, pp. 17, 22 and 23 (2006).

* cited by examiner

METHOD OF MANUFACTURING SILICON-ON-INSULATOR WAFERS

FIELD OF THE INVENTION

The field of the invention relates generally to a method of manufacturing multilayer semiconductor structure, e.g., silicon-on-insulator wafers, having reduced warp and bow.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a silicon-on-insulator (SOI) structure) generally comprises a handle wafer or layer, a device layer, and an insulating (i.e., dielectric) film (typically an oxide layer) between the handle layer and the device layer. Generally, the device layer is between 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. (See, e.g., U.S. Pat. No. 5,189,500, which is incorporated in its entirety herein by reference.) A particular challenge in the preparation of SOI structures is the presence of warp or bow, particularly when a portion of the buried oxide (BOX) is contributed from the bonding surface of the device wafer. If the BOX thickness is different from (typically more than) the thickness of the oxide on the backside of the support wafer, the SOI wafer will have high warp or bow which can be over the acceptable limit. High warp or bow can cause serious problems, such as handling in SOI wafering and fabrication lines.

BRIEF DESCRIPTION OF THE INVENTION

Briefly, therefore, the present invention is directed to a method of preparing a multilayer semiconductor structure. The method comprises the following steps in order: (a) forming a dielectric layer on a front surface of a semiconductor device substrate, the semiconductor device substrate comprising two major, generally parallel surfaces, one of which is the front surface of the semiconductor device substrate and the other of which is a back surface of the semiconductor device substrate, a circumferential edge joining the front and back surfaces of the semiconductor device substrate, and a central plane between the front and back surfaces of the semiconductor device substrate; (b) bonding the front surface of the semiconductor device substrate having the dielectric layer to a front surface of a handle substrate to thereby form a bonded structure, wherein the handle substrate comprises two major, generally parallel surfaces, one of which is the front surface of the handle substrate and the other of which is a back surface of the handle substrate, a circumferential edge joining the front and back surfaces of the handle substrate, and a central plane between the front and back surfaces of the handle substrate; and (c) forming a dielectric layer on the back surface of the handle substrate.

BRIEF DESCRIPTION OF THE DRAWING(S)

DETAILED DESCRIPTION OF THE EMBODIMENT(S) OF THE INVENTION

Figure 1A:
FIGS. 1A through 1E are illustrations depicting the process of the present invention.

The present invention is directed to a method for manufacturing a multilayer semiconductor structure, e.g., a silicon-on-insulator (SOI) multilayer structure, with overall reduced warp and bow in the final semiconductor composite multilayer structure. The multilayer semiconductor structure comprises a device substrate, a handle substrate, and an intervening dielectric layer. In some embodiments, the method of the present invention is directed to the manufacture of a silicon-on-insulator structure comprising an oxide layer in between an active silicon layer of a device substrate and a handle substrate. The oxide layer is commonly referred to as Buried Oxide (or "BOX"). According to the method of the present invention, the BOX may be prepared on the device substrate, the handle substrate, or on both substrates prior to substrate bonding.

During manufacture of a silicon-on-insulator multilayer structure, a dielectric layer, e.g., an oxide layer, may be prepared on the front surface of the handle substrate. The formation of a dielectric layer on the surface of a semiconductor substrate, i.e., the front surface of either or both of the device substrate and the handle substrate, may cause stresses in the bulk of the substrate, which may or may not be sufficiently offset in the bulk of the substrate. The dielectric layer may thus induce stresses that may result in a final SOI having warp and bow. Stresses may form in a device and/or handle substrate as the wafer cools from the temperature of dielectric formation to room temperature.

A dielectric layer, typically an oxide layer, may be formed one or both of the front surfaces of the device substrate and the handle substrate at high temperature. Herein, the front surfaces of the substrate refer to the major surfaces of the substrates that, when bonded, form the interior surfaces of the bonded structure. Back surfaces thus refer to the major surfaces that become the exterior surfaces of the bonded structure. The temperature of deposition generally exceeds 500° C. and may even exceed 1000° C. In some embodiments, the dielectric layer(s), e.g., oxide layer(s), may be deposited to substantially equal thickness and density on both of the front surfaces of the device and handle substrates. When the substrates with dielectric deposited on the front surfaces are moved into a room temperature environment, both the substrate (e.g., silicon) and the dielectric layer (e.g., silicon dioxide) contract, but at different rates. The different rates of contraction are due to the different coefficients of thermal expansion of the native substrate material and the deposited dielectric layer. Silicon, for example, has a coefficient of thermal expansion of 2.6 ppm/° C. Silicon dioxide has a coefficient of thermal expansion of 0.5 ppm/° C. In view of these different coefficients, silicon expands or contracts more than silicon dioxide in response to changes in temperature. The contraction differential inputs stress into the substrate as the substrate having dielectric deposited thereon cools from the temperature of deposition to room temperature.

In some manufacturing processes, a substrate, either the device or handle or both, may be prepared with dielectric layers (e.g., oxide layers) on both the front and the back surfaces. In such embodiments, the stresses induced by differential contraction in front surface dielectric layer may be offset by the stress from the backside surface dielectric layer. The overall stress on the substrate may thus be minimized. However, when the dielectric layer is removed from one side of the substrate while the opposite surface of the substrate has dielectric layer, stresses may input in the substrate during subsequent high temperature process steps due the difference in contraction between the native substrate structure and the remaining dielectric on the surface having dielectric.

In still other manufacturing processes, stress may be inputted into a substrate after bonding of the device and handle wafers and during the thinning process. Herein, the oxide layer on the backside surface of the device wafer is removed, the buried oxide (BOX) contributed partially from the device wafer is thicker than the oxide layer on the backside surface of the handle wafer. In this case, the stress from the BOX may not be fully offset by the stress from the backside oxide of the handle wafer. Unbalanced stresses on both surfaces may result in warp or bow in the substrate.

According to the method of the present invention, stresses induced by an intervening dielectric layer in a bonded structure may be offset by oxidizing the back, exterior surface of the handle substrate after the handle substrate is bonded to the device substrate to form a bonded structure. Offsetting the stresses induced by thermal expansionary mismatch between the native silicon substrate and a dielectric layers by depositing dielectric on both the front and back surfaces of the bonded pair results in a final SOI structure exhibiting minimum amount of warp or bow, approximating that of the support substrate before oxidation. In some embodiments, the method of the present invention is therefore directed to offsetting the stresses contributed by the dielectric layer, e.g., the BOX layer, thus enabling the preparation of low warp or bow semiconductor multilayer structures.

In some embodiments in which a silicon-on-insulator multilayer structure is manufactured, dielectric layers, e.g., oxide layers, may be prepared on both the front surface of the handle substrate and on the front surface of the device substrate. Accordingly, the BOX layer may comprise a combination of oxide layers from the handle substrate and device substrate. A BOX layer prepared by combining two oxide layers may be preferable in some manufacturing processes due to, e.g., a desire to provide space between the active silicon layer and the bonding interface since the bonding interface may be contaminated with metals and/or particles, which may diffuse into the active silicon layer, thereby impairing the device's electrical properties. A BOX layer may be prepared by combining oxide layers from the handle substrate and device substrate also due to certain applications, wherein the device surface is roughened or uneven due to processing or patterning before bond. In order to cover the uneven or rough front surface on the device wafer, oxide, such as chemical vapor deposition oxide (CVD oxide), may be deposited on the device wafer prior to bonding. In embodiments wherein the BOX is formed from oxide layers deposited on the front surfaces of both the device substrate and the handle substrate, the resultant multilayer SOI structure may have a BOX that contributes stresses to the structure that may not be sufficiently offset by dielectric on the back surface(s) of the handle and/or device substrates since the BOX layer may be significantly thicker than the oxide layer on the back surface(s) of the handle and/or device substrates. The inability of dielectric on the back surface(s) of the device and/or handle substrates to offset the stresses contributed by the BOX may result in an SOI multilayer structure having warp or bow over an acceptable limit, and the structure may take a domed warp shape. SOI structures with high warp or bow pose serious problems in SOI wafering line and in fabrication line, such as handling. For example, a chip manufacturer's maximum tolerance may allow warp no greater than about 60 micrometers, while some manufacturing processes may allow warp no greater than 30 micrometers. The method of the present invention enables the manufacture of SOI structures having warp within these chip manufacturing process tolerances. Stated another way, multilayer semiconductor structures, such as SOI structures, prepared according to the method of the present invention have warp no greater than 35 about micrometers, no greater than about 30 micrometers, no greater than about 28 micrometers, or even no greater than about 25 micrometers.

In some embodiments, the present invention is directed to a method of preparing semiconductor multilayer structures comprising a dielectric layer having low warp and bow. The dielectric layer intervening a handle substrate and a device substrate is generally a source of stress that may contribute to the warp and bow of the final multilayer structure. According to the method of the present invention, stresses contributed by a dielectric layer, e.g., a relatively thick BOX layer, may be offset by the deposition of a dielectric layer, e.g., an oxide layer, on the back surfaces of the device substrate, the handle substrate, or on both back surfaces of the device substrate and the handle substrate. The oxide layers deposited on the back surfaces of the device substrate and/or the handle substrate may be deposited after bonding and before thinning the device wafer of the bonded pair. In preferred embodiments, oxide is deposited on both backside surfaces of the device substrate and the handle substrate. Through the method of the present invention, backside oxide on the handle substrate may be adjusted to counter-balance stresses contributed by the BOX. Therefore, the final SOI structure warp or bow may be maintained within a tolerable level. As an added advantage, the bond between the substrates may be strengthened during the furnace cycle where thermal oxide is grown on the bonded pairs of wafers or densification of chemical vapor deposition oxide (CVD oxide) on the bonded pairs of wafers. The strengthened bond may help the thinning process on the device wafers during SOI wafering, for instance reducing active silicon layer delamination.

With reference now to FIGS. 1A through 1E and more specifically FIG. 1A, the substrates for use in the present invention include a monocrystalline donor substrate 10 and a monocrystalline handle substrate 20. In general, the monocrystalline substrates comprises two major, generally parallel surfaces, one of which is a front surface of the substrate and the other of which is a back surface of the substrate, a circumferential edge joining the front and back surfaces, and a central plane between the front and back surfaces. Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, "front surface" refers to the major surface of the substrate that becomes an interior surface of the bonded structure. "Back surface" refers to the major surface that becomes an exterior surface of the bonded structure.

The monocrystalline donor and handle substrates may be semiconductor wafers. In preferred embodiments, the semiconductor wafers comprise a material selected from the group consisting of silicon, silicon carbide, silicon germanium, silicon nitride, silicon dioxide, gallium arsenic, gallium nitride, indium phosphide, indium gallium arsenide, germanium, and combinations thereof. In particularly preferred embodiments, the semiconductor wafers comprise a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, both device wafer and support wafer have mirror-polished front surface finishes that are free from surface defects, such as scratches, large particles, etc. Wafer thickness generally varies from about 250 micrometers to about 1500 micrometers, with thicknesses in the range of about 500 micrometers to about 1000 micrometers, such as about 725 micrometers, being preferred.

Figure 1B:
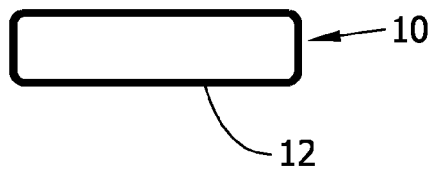

According to the method of the present invention, an embodiment thereof depicted in FIGS. 1A through 1E and more specifically shown in FIG. 1B with respect to the device substrate 10, a dielectric layer 12, e.g., an oxide layer or a nitride layer, may be formed on a front surface of a device substrate 10, a front surface of a handle substrate, or on both front surfaces of a device substrate and a handle substrate. Dielectric layers prepared by oxidation generally deposit a layer of silicon dioxide ($SiO_2$) on the wafer surface while nitridation generally deposits a layer of silicon nitride ($Si_3N_4$) on the wafer surface. In general, an oxide layer may be formed on a silicon substrate generally by thermal oxidation or chemical vapor deposition.

In some embodiments, the dielectric layer comprises a silicon oxide ($SiO_2$) layer formed on a front surface of a device substrate, a front surface of a handle substrate, or on both front surfaces of a device substrate and a handle substrate by thermally growing oxide on the silicon wafer surface in a furnace at elevated temperature. The thermal oxidation of a front surface of a device substrate, a front surface of a handle substrate, or on both front surfaces of a device substrate and a handle substrate is generally performed in a vertical furnace with steam ($H_2O$ or mixture of hydrogen and oxygen gas) and/or oxygen at a temperature in excess of about 700° C., generally between 800° C. and about 1200° C. The thermal oxidation is typically performed in a vertical furnace, e.g., commercially available AMS400. The oxidizing ambient may also contain several percent of hydrochloric acid (HCl). The chlorine removes metal ions that may occur in the oxide. Thermal oxidation of a front surface of a device substrate, a front surface of a handle substrate, or on both front surfaces of a device substrate and a handle substrate generally proceeds until a silicon dioxide layer is formed having a thickness between about 50 nanometers and about 5000 nanometers, preferably between about 100 nanometers and about 2000 nanometers.

In some embodiments, the dielectric layer comprises a silicon oxide ($SiO_2$) layer formed on a front surface of a device substrate, a front surface of a handle substrate, or on both front surfaces of a device substrate and a handle substrate by chemical vapor deposition. The deposition of CVD oxide on the front surface of the device substrate, the handle substrate or both may be performed in a furnace in an ambient comprising a silicon-containing gas and an oxidant. In some embodiments, the ambient atmosphere comprises silane ($SiH_4$) and oxygen ($O_2$). In some embodiments, the ambient atmosphere comprises dichlorosilane ($SiCl_2H_2$) and nitrous oxide ($N_2O$). In some embodiments, the ambient atmosphere comprises tetraethylorthosilicate ($Si(OC_2H_5)_4$). CVD oxide may be deposited on the wafers in a CVD tool, e.g. commercial available Walker Johnson. Chemical vapor deposition of the oxide layer generally occurs at temperatures between about 300° C. and about 900° C. The temperature may vary depending upon the particular recipe selected for CVD oxide. For example, silane ($SiH_4$) and oxygen ($O_2$) generally deposits silicon dioxide at temperatures between about 300° C. and about 500° C. Dichlorosilane ($SiCl_2H_2$) and nitrous oxide ($N_2O$) generally deposits silicon dioxide at temperatures between about 700° C. and about 900° C. Tetraethylorthosilicate ($Si(OC_2H_5)_4$) generally deposits silicon dioxide at temperatures between about 600° C. and about 800° C. Chemical vapor deposition of the oxide layer on a front surface of a device substrate, a front surface of a handle substrate, or on both front surfaces of a device substrate and a handle substrate generally proceeds until a silicon dioxide layer is formed having a thickness between about 50 nanometers and about 5000 nanometers, preferably between about 300 nanometers and about 2000 nanometers. The chemical vapor deposition oxide layer is generally densified by annealing the substrate in a furnace to increase the strength of the oxide layer. Densification generally occurs at a temperature between about 1000° C. and about 1200° C. for several hours, typically 2 hours.

The front surfaces of substrates may be oxidized by either thermal oxidation or densified CVD oxide. The proper oxidation technique may depend, at least in part, on the requirements of the SOI device fabrication process. For example, if the device is highly sensitive to electrical properties and/or metals between the silicon (device layer) and the silicon dioxide interface, thermal oxidation is generally applied. In some embodiments in which high uniformity (e.g. <100 Angstroms) of the oxide layer is required, the device and/or handle substrate surfaces may be thermally oxidized.

Figure 1C:
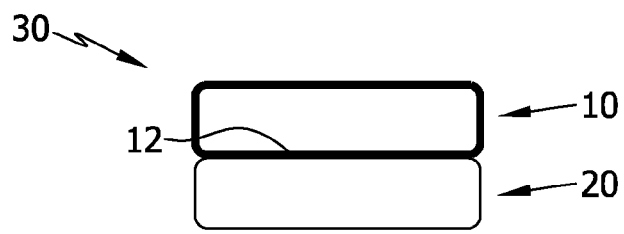

According to the method of the present invention, an embodiment thereof depicted in FIGS. 1A through 1E and more specifically in FIG. 1C, the front surface 12 of the device substrate 10 having the dielectric layer thereon and the front surface of the handle substrate 20 are bonded. Herein, the front surface 12 of the device substrate 10, the front surface of the handle substrate 20, or both may contain a dielectric layer, e.g., a silicon dioxide layer, deposited by thermal oxidation and/or chemical vapor deposition. The silicon dioxide layer may have a thickness generally between about 50 nanometers and about 5000 nanometers, such as between about 100 nanometers and about 2000 nanometers. Bonding occurs by bringing the front surfaces of the device substrate and the handle substrate together into intimate contact to thereby form a bonded structure. Bonding takes part in a bonding tool, for example, a commercially available EV850 (made by Electronic Vision), in which a device substrate and a support substrate are bonded together. Since the mechanical bond is relatively weak, the bonded structure 30 is further annealed to solidify the bond between the donor wafer and the handle wafer. Post bond heat treatment can be performed in an electric oven, such as a commercially available Blue M. The bonded structure 30 may be heat-treated at a temperature between about 200° C. and about 1000° C., preferably at a temperature of about 500° C. The thermal treatment may have a duration between about 1 hour and about 12 hours, preferably for about 6 hours.

In some embodiments, the bonded multilayer structure is subjected to a post bond anneal. A post-bond anneal further increases the bonding strength as anneal temperature is significantly higher than that of post-bond heat treatment. The post-bond anneal may occur in a temperature between about 800° C. and about 1200° C., preferably at a temperature of about 1150° C. The post-bond anneal may have a duration between about 1 hour and about 10 hours, preferably for about 4 hours.

Figure 1D:
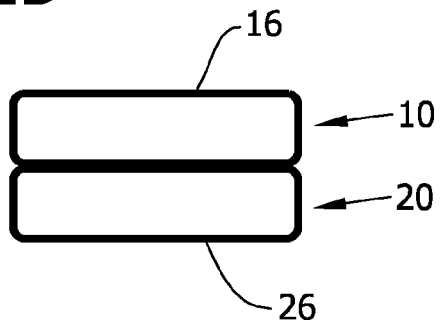

After the front surfaces of the device substrate 10 and the handle substrate 30 have been bonded, as depicted in FIG. 1D, a dielectric layer, e.g., an oxide layer, is formed on the back surface 16 of the device substrate 10, the back surface 26 of the handle substrate 20, or both back surfaces of the device substrate and the handle substrate. The back surface of the device substrate, the handle substrate, or both may be oxidized by thermal oxidation or chemical vapor deposition. The same thermal oxidation and CVD oxidation processes may be used to oxidize the back surfaces of the substrates in the multilayer structure which were employed to oxidize the front surfaces of the handle substrate, device substrate, or both. In general, the thickness of the oxide layers on the back surface of the device substrate, the back surface of the handle surface, or both back surfaces of the device substrate and the handle substrate may be between about 50 nanometers and about 5000 nanometers, preferably between about 500 nanometers and about 2000 nanometers. The thickness of the oxide layer or layers deposited on one or both back surfaces are determined in part by the thickness of the BOX layer bonding the front surfaces of the device substrate and handle substrate. The thickness of the BOX layer and the cumulative thickness of the backside surface silicon dioxide layer(s) are preferably comparable in thickness in order to adequately offset stresses induced by the differential coefficients of thermal expansion of the native silicon and the silicon dioxide. In embodiments wherein the BOX layer is prepared by densified CVD oxide, the cumulative thickness of the backside surface silicon dioxide layers may be determined empirically by a calibration method in order to optimize the cumulative thickness necessary to offset stresses induced by the densified CVD oxide BOX layer.

In some embodiments, the back surface of the device substrate, the handle substrate, or both may be oxidized by thermal oxidation. In embodiments wherein intervening dielectric layer, e.g., a BOX layer, and the back surface of the device substrate, the handle substrate, or both were oxidized by thermal oxidation, the thermal oxide thickness to be grown on the bonded pair generally equal to the thickness of thermal oxide used to form the BOX layer between the bonded front surfaces. Simply stated, the process recipe of thermal oxidation on the bonded pair is about the same as the process recipe that is used to grow thermal oxide on the device wafer prior to bonding.

In some embodiments in which the dielectric layer, e.g., the BOX layer, is prepared by densified chemical vapor deposition oxidation, the proper thickness of the thermal oxide formed on the back surface of the device substrate, the handle substrate, or both to counter-balance the stress of the CVD oxide layer should be determined empirically since densified CVD oxide has less stress while compared with thermal oxide. The proper thickness of thermal oxide that is needed to count-balance densified CVD oxide is determined experimentally. For instance, if the densified CVD oxide layer thickness is about 1 micrometer, a calibration series of back surface oxide thicknesses (e.g. 0.3 um, 0.5 um, 0.7 um, etc.) may be grown on the surfaces of the tested substrates. Warp/bow is measured to determine which thickness of thermal oxide gives the lowest warp/bow. The lowest warp/bow translates into the proper backside surface oxide thickness to properly offset the stresses induced by the CVD oxide layer. Generally, the thickness of thermal oxide to be grown on the bonded pair is somewhat less than the thickness of the densified oxide on the bonding surface of the device wafer.

Figure 1E:
Figure 2:
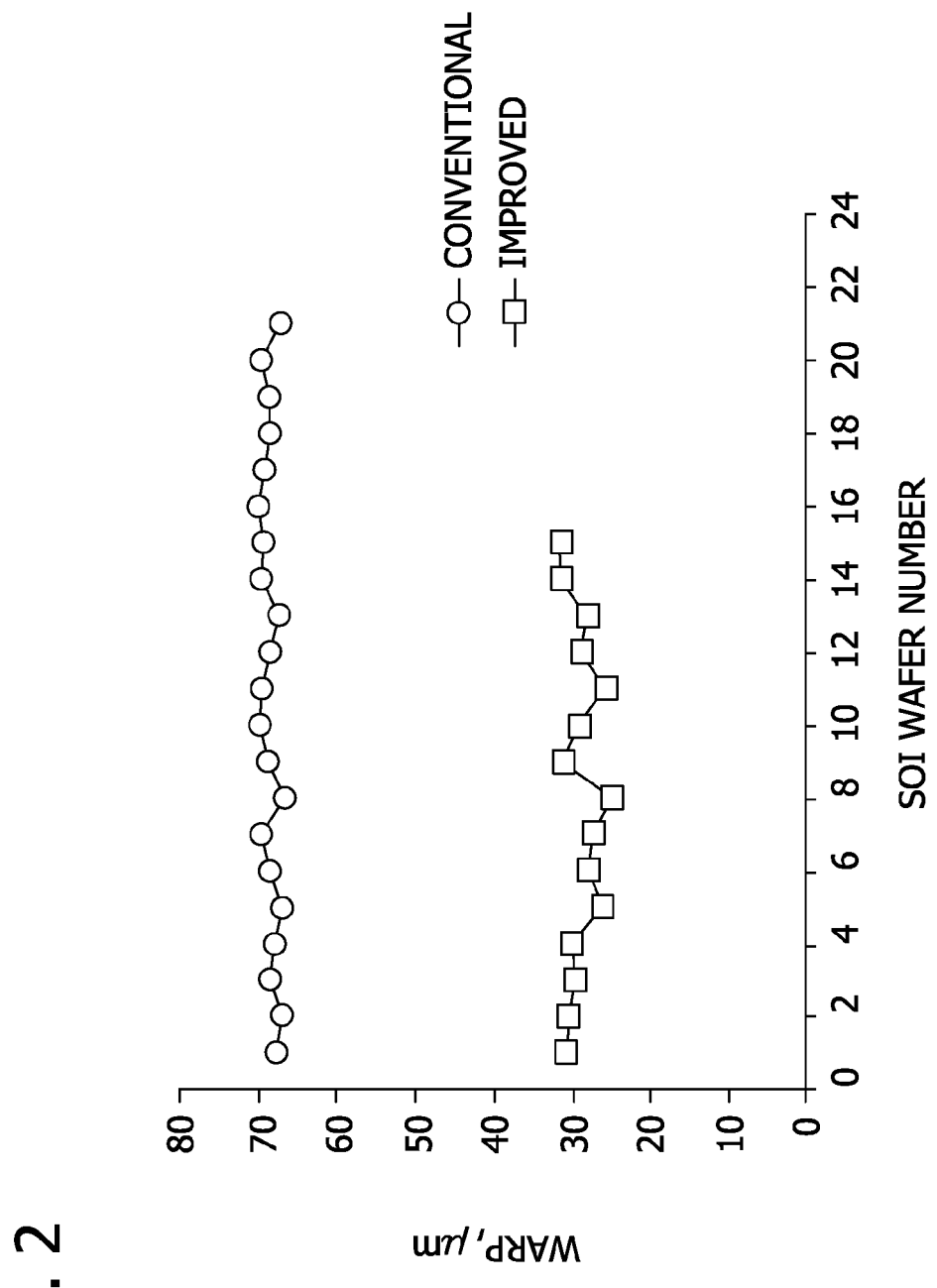
FIG. 2 is a graph depicting the measured warp in SOI structures prepared according to a conventional process (●) and the measured warp in SOI structures prepared according to the method of the present invention (■). The SOI structures were prepared according to the method described in Example 1.

Upon formation of a dielectric layer, e.g., a silicon oxide layer, on the back surface of the back surface of the device substrate, the back surface of the handle surface, or both back surfaces of the device substrate and the handle substrate, as depicted in FIGS. 1A through 1E and more specifically in FIG. 1E, the back surface of the device substrate 10 is thinned by grinding, polishing, etching, or any combination of surface treatments. In general, the device substrate 10 is thinned until the device substrate has a thickness between about 1 micrometer and about 300 micrometers, such as between about 3 micrometers and about 300 micrometers, or about 3 micrometers and 70 micrometers, such as about 7 micrometers. The thickness of thinned device substrate 18 depends upon the final end use of the SOI structure and is determined by customer specifications. Surface grinding typically uses a single-side grinder, such as Disco grinder DFG-830 made by Disco Incorporation. In the surface grinding, most materials of the device wafer are removed from the backside of the device wafer after bonded. Edge treatment could include several steps, for instance, edge grinding and device wafer edge etching. Edge grinding uses typically an edge profiler, such as STC EP-5800RHO.

In embodiments wherein the back surface of the semiconductor device substrate is etched, alkali etchants or acidic etchant are applicable. Alkali etchants are preferred. Acidic etchants include, e.g., a mixture of hydrochloric acid, nitric acid, phosphoric acid, and hydrofluoric acid. Alkali etchants include KOH and NaOH. Etching processes are generally known in the art.

In embodiments wherein the back surface of the semiconductor device substrate is polished, either a single-side or double-side polishing or both can be applied to polish the back surface. Single-side polishing may be accomplished using a commercially available tool such as Strasbaugh Mark 9-K, while double-side polishing use a commercially available tool such as PeterWolters AC2000-P.

After all process steps are completed, the SOI wafers are inspected for all the required parameters, such as flatness, particles, etc. before final package for customers. In general, multilayer semiconductor structures, such as SOI structures, prepared according to the method of the present invention have warp no greater than 35 micrometers, no greater than 30 micrometers, no greater than about 29 micrometers, or even no greater than about 28 micrometers. In some embodiments the warp may be less than about 26 micrometers, less than about 25 micrometers, or even less than about 24 micrometers.

Having described the invention in detail, it will be apparent that modifications and variations are possible without departing from the scope of the invention defined in the appended claims.

The following non-limiting examples are provided to further illustrate the present invention.

EXAMPLE 1

Preparation of Reduced Warp/Bow SOI Structures

Multiple device wafers and the handle wafers were bonded. The bonded structures were heat-treated in a Blue M oven for 6 hours at the temperature of 500° C. The post heat-treated bonded structures were coated with CVD oxide on both exterior, major surfaces. More specifically, the back surfaces of the bonded device wafer and handle wafer were both oxidized by CVD oxidation. CVD oxidation was carried out by decomposing tetraethyl orthosilicate ($Si(OC_2H_5)_4$) in an CVD tool (AMAT Precision 5000, SVG Thermal Vertical Furnace) at a temperature of about 700° C. The CVD oxide thickness was about 1 micrometer. The bonded structures were annealed at a temperature of 1000° C. for about 2 hours in an anneal furnace (AMS 400, SVG Thermal Vertical Furnace). The total thickness of the oxide layers on the back surfaces of the device and handle wafers was substantially the same as the thickness of the BOX layer. The device layer was thinned, including grinding, etching, polishing and cleaning to achieve the top silicon layer thickness, uniformity and surface quality per customer specifications. See FIG. 1, which is a graph depicting the measured warp in several bonded structures prepared according to the conventional process in which the exterior major surfaces of the bonded structure were not subjected to an additional oxidation process (●) and the measured warp in several bonded structures prepared according to the above-described process of the invention (■). The measured warp in conventionally prepared bonded structures average about 69 micrometers, with some structures exhibiting warp over 70 micrometers. In contrast, the measured warp in bonded structures prepared according to the method of Example 1 averaged about 29 micrometers, with some structures exhibiting warp less than 27 micrometers, or even less than 25 micrometers.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of preparing a multilayer semiconductor structure, the method comprising the following steps in order:
    (a) forming a first dielectric layer on a front surface of a semiconductor device substrate, the semiconductor device substrate comprising two major, generally parallel surfaces, one of which is the front surface of the semiconductor device substrate and the other of which is a back surface of the semiconductor device substrate, a circumferential edge joining the front and back surfaces of the semiconductor device substrate, and a central plane between the front and back surfaces of the semiconductor device substrate;
    (b) bonding the front surface of the semiconductor device substrate having the first dielectric layer to a front surface of a handle substrate to thereby form a bonded structure, wherein the handle substrate comprises two major, generally parallel surfaces, one of which is the front surface of the handle substrate and the other of which is a back surface of the handle substrate, a circumferential edge joining the front and back surfaces of the handle substrate, and a central plane between the front and back surfaces of the handle substrate;
    (c) forming a second dielectric layer on the back surface of the handle substrate ; and
    (d) thinning the semiconductor device substrate.

2. The method of claim 1 wherein the semiconductor device substrate comprises a material selected from the group consisting of silicon, silicon carbide, silicon germanium, silicon nitride, silicon dioxide, gallium arsenic, gallium nitride, indium phosphide, indium gallium arsenide, germanium, and combinations thereof.

3. The method of claim 1 wherein the semiconductor device substrate comprises a silicon wafer sliced from a single crystal silicon ingot grown by the Czochralski method.

4. The method of claim 3 wherein the first dielectric layer formed on the front surface of the semiconductor device substrate comprises silicon dioxide.

5. The method of claim 4 wherein the first dielectric layer comprising silicon dioxide has a thickness between about 50 nanometers and about 5000 nanometers.

6. The method of claim 1 wherein the handle substrate is a silicon wafer.

7. The method of claim 6 wherein the handle substrate further comprises a third dielectric layer on the front surface thereof.

8. The method of claim 7 wherein the third dielectric layer comprises silicon dioxide and has a thickness between about 50 nanometers and about 5000 nanometers.

9. The method of claim 6 wherein the second dielectric layer formed on the back surface of the handle substrate during step (c) comprises silicon dioxide.

10. The method of claim 9 wherein the second dielectric layer comprising silicon dioxide has a thickness between about 50 nanometers and about 5000nanometers.

11. The method of claim 1 wherein step (c) further comprises concurrent formation of a fourth dielectric layer on the back surface of the semiconductor device substrate.

12. The method of claim 11 wherein both the second dielectric layer formed on the back surface of the handle substrate and fourth dielectric layer on the back surface of the semiconductor device substrate comprises silicon dioxide.

13. The method of claim 12 wherein the second and fourth dielectric layers comprising silicon dioxide have thicknesses between about 50 nanometers and about 5000 nanometers.

14. The method of claim 13 wherein the semiconductor device substrate is thinned by grinding, etching, polishing or any combination of such techniques the back surface of the semiconductor device substrate.

15. The method of claim 14 wherein after step (d), the thinned semiconductor device substrate has a thickness between about 3 micrometers and about 70 micrometers.

16. The method of claim 1 wherein the multilayer semiconductor structure has warpage no greater than 30 micrometers.

* * * * *